United States Patent [19]
Kitamura et al.

[11] Patent Number: 5,296,812
[45] Date of Patent: Mar. 22, 1994

[54] SUPERCONDUCTING MAGNET ASSEMBLY FOR MRI AND MRI DIAGNOSTIC APPARATUS

[75] Inventors: Masashi Kitamura, Kashiwa; Shigeru Kakugawa, Hitachi, both of Japan

[73] Assignee: Hitachi, Ltd., Tokyo, Japan

[21] Appl. No.: 998,852

[22] Filed: Dec. 30, 1992

[30] Foreign Application Priority Data

Jan. 8, 1992 [JP] Japan .................. 4-001318

[51] Int. Cl.$^5$ ............................................. G01R 33/20
[52] U.S. Cl. ................................ 324/319; 335/216
[58] Field of Search ............... 324/300, 307, 309, 318, 324/319, 320, 322; 335/219, 216

[56] References Cited
U.S. PATENT DOCUMENTS 4,180,769 12/1979 Gang ................................. 324/319
4,876,510 10/1989 Siebold et al. ..................... 324/318

Primary Examiner—Michael J. Tokar
Attorney, Agent, or Firm—Fay, Sharpe, Beall, Fagan, Minnich & McKee

[57] ABSTRACT

A superconducting means for MRI including seven to nine small superconducting coils situated in such a manner that the number of turns of these coils becomes progressively greater towards the outside, and preventing the occurrence of 2nd to 16th order inhomogeneous fields.

8 Claims, 5 Drawing Sheets

F I G. 4
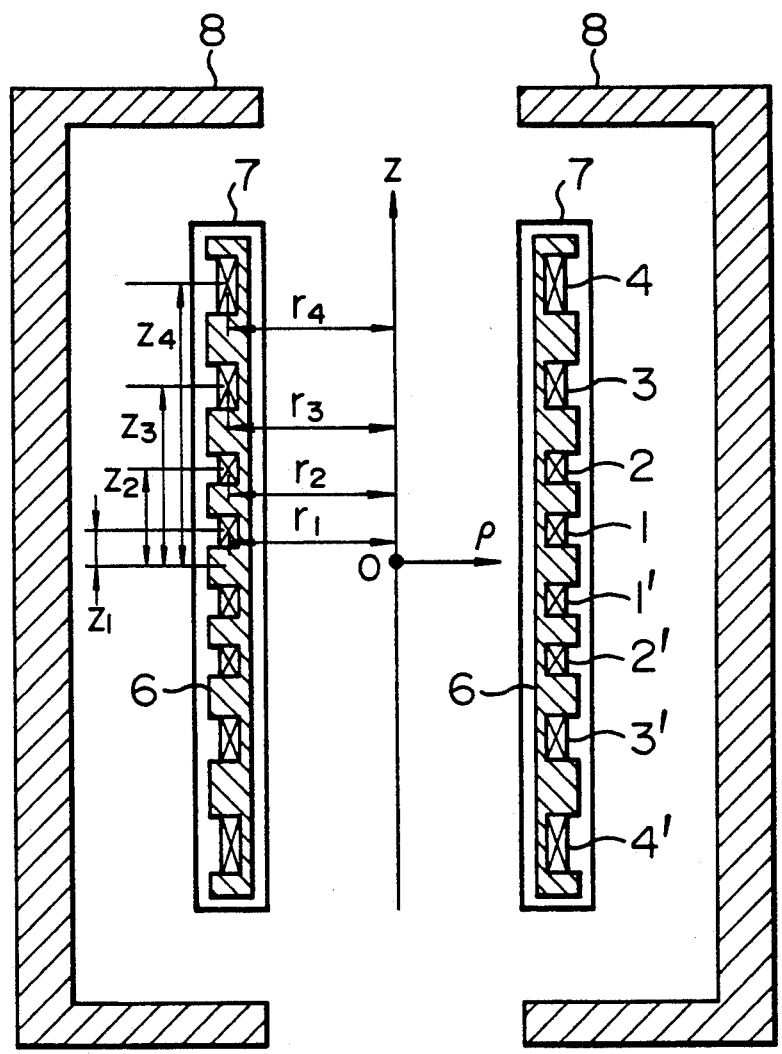

SUPERCONDUCTING MAGNET ASSEMBLY FOR MRI AND MRI DIAGNOSTIC APPARATUS

BACKGROUND OF THE INVENTION

This invention relates to a superconducting magnet for MRI suitable for generating a homogeneous field, and to an MRI diagnostic apparatus.

A typical superconducting magnet for MRI of the prior art is described in U.S. Pat. No. 4,876,510 entitled "Apparatus for Nuclear Spin Tomography Having Superconducting Base Field Coils and a Radiation Shield". This reference discloses a coil arrangement in which six small superconducting coils having a substantially equal mean winding radius are disposed symmetrically with respect to a central plane of a magnet and coaxially along a central axis of this magnet.

When the position and magneto-motive force of each of the small superconducting coils are regulated in the coil arrangement described above, an excellent homogeneous field devoid of second to tenth order inhomogeneous fields can be generated in a substantially spherical region at the center of the magnet. To obtain a tomogram having higher quality in the field of nuclear magnetic imaging, however, a more homogeneous field is required.

SUMMARY OF THE INVENTION

It is an object of the present invention to provide a superconducting magnet assembly for MRI devoid of second to twelfth order, second to fourteenth order and second to sixteenth order inhomogeneous fields among those inhomogeneous fields which are contained in a field at the center of the superconducting magnet described above, and having higher homogeneity of the field than that of the prior art, and to provide also an MRI diagnostic apparatus.

In a superconducting magnet for MRI including superconducting coils having axial symmetry with respect to a central axis, the object of the present invention described above can be accomplished by constituting the superconducting coils by seven, eight or nine small superconducting coils which are disposed symmetrically with respect to a central plane of a magnet and coaxially along a central axis.

Next, the method of reducing the inhomogeneous field for accomplishing the object described above will be explained.

The inhomogeneous field is the sum of inhomogeneous fields generated by superconducting coils and magnetic shield member. Examples of the magnetic shield member are an iron sheet, a coil, and so forth. The magnetic shield member may be of a unitary type or a discrete type comprising a plurality of segments. In other words, the number and shape of the magnetic shield member are not limited, in particular. The second to twelfth order inhomogeneous fields can be made zero by optimizing the position and magneto-motive force of each small superconducting coil so that the inhomogeneous field resulting from the superconducting coil has an equal absolute value to that of the inhomogeneous field resulting from the magnetic shield but has an opposite direction to that of the latter. When the field of each small superconducting coil is determined in this manner, both fields offset with each other, so that the second to twelfth order inhomogeneous fields can be eliminated. The optimal relative position and magneto-motive force distribution of each small superconducting coil can be determined by a computer program having a precision computation function of the field by the magnetic shield and the optimization function of the coil arrangement.

When the number of small superconducting coils that constitute the superconducting coil is seven (7), let's assume that magneto-motive force of the small superconducting coil positioned at the center of the magnet is at$_1$, the mean winding radius of each of the first, second and third small superconducting coils from the center towards the outside in an axial direction r$_n$, their mean distance from the central plane z and their magneto-motive force at$_n$ are r$_2$, z$_2$ and at$_2$; r$_3$, z$_3$ and at$_3$; and r$_4$, z$_4$ and at$_4$, respectively. Since the mean winding radius of each small superconducting coil is substantially equal, six kinds of parameters, that is, z$_2$/r$_2$, z$_3$/r$_3$ and z$_4$/r$_4$ representing the relative positions of the small superconducting coils, and at$_2$/at$_1$, at$_3$/at$_1$ and at$_4$/at$_1$ representing the magneto-motive force distribution of the small superconducting coils, can be selected as non-dimensional parameters the magnitude of which can be adjusted independently in this magnet. This means that the degree of freedom of this superconducting magnet can be regarded as 6.

Incidentally, since homogeneity of the field at the central portion of the magnet and the relative position of each small superconducting coil are taken into specific consideration in the present invention, a non-dimensionalized quantity is employed.

On the other hand, when the central axis of the superconducting magnet is a z axis, r and $\theta$ are polar coordinates having the origin at the center of the magnet and $P_n(\cos\theta)$ in an n-th order Legendre function, then, the field in the z direction near the center of the magnet can be expressed in the following expanded form:

$$B_z = \sum_{n=0,2,4,...}^{\infty} d_n r^n P_n(\cos\theta) \qquad (1)$$

Here, d$_0$ is a homogeneous field, and d$_2$, d$_4$, d$_6$, ... are the intensity of inhomogeneous fields that lower homogeneity of the field.

The equation given above is an expansion by orthogonal functions. Accordingly, the field of each term is independent of other, and does not depend on others. This means that the intensity of the expansion term can be set to a substantially desired value by the number corresponding to the degree of freedom, by adjusting the six independent parameters.

The present invention makes zero the coefficients (d$_2$, d$_4$, d$_6$, d$_8$, d$_{10}$, d$_{12}$) of the first six terms of the inhomogeneous fields in accordance with the principle given above. Accordingly, since the second to twelfth order inhomogeneous fields can be eliminated, a more homogeneous field can be obtained than by the prior art.

In the case of superconducting magnets comprising eight or nine superconducting coils, the degree of freedom of these magnets can be regarded as 7 or 8. For the same reason as described above, the second to 14th and second to 16th order inhomogeneous fields can be made zero by optimizing the relative position and magneto-motive force distribution of each small superconducting coil. Therefore, a more excellent homogeneous field can be obtained.

According to the present invention, a homogeneous field can be generated in a broader range than in the conventional superconducting magnet for MRI. Accordingly, the superconducting magnet can be made more compact in size and its production cost can be reduced.

BRIEF DESCRIPTION OF THE DRAWINGS

FIG. 4 is a sectional view of a superconducting magnet for MRI according to another embodiment of the present invention;

DESCRIPTION OF THE PREFERRED EMBODIMENTS

Hereinafter, an embodiment of the present invention will be described with reference to FIGS. 1 to 3.

Figure 1:
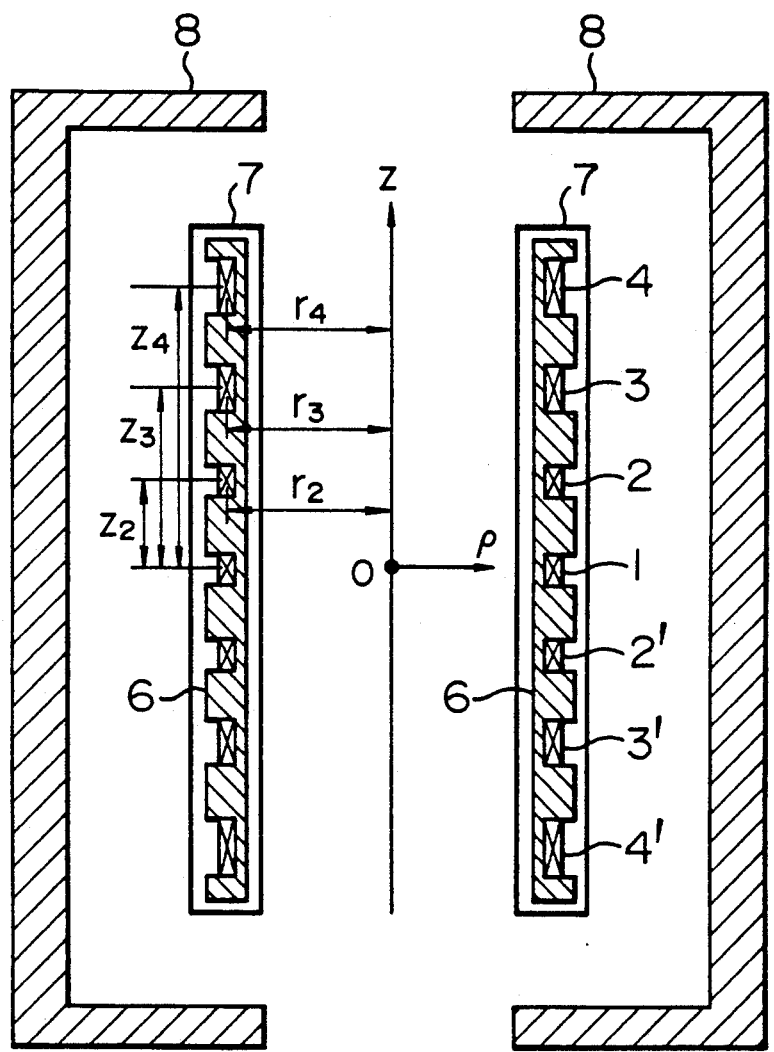
FIG. 1 is a sectional view of a superconducting magnet for MRI according to an embodiment of the present invention.

FIG. 1 is a sectional view of a superconducting magnet for MRI according to this embodiment.

A small superconducting coil 1 and three kinds of small superconducting coils 2, 2', 3, 3', 4 and 4' are wound on a bobbin 6 made of a non-magnetic material. These seven small superconducting coils have a substantially equal mean winding radius and are disposed symmetrically with respect to a central plane ($z=0$) of a magnet. The central axis of each small superconducting coil is in conformity with the z axis.

Figure 2:
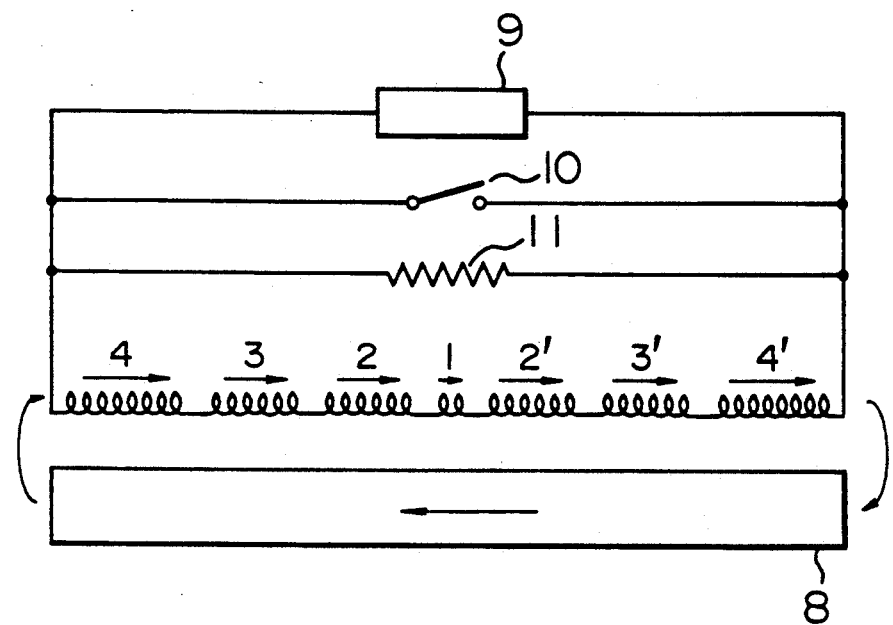
FIG. 2 is a circuit diagram of the superconducting magnet for MRI in the embodiment of the present invention.

FIG. 2 is a circuit diagram of the super-conducting magnet for MRI according to this embodiment. The circuit includes a current supply 9, a persistent current switch 10, a dump resistor 11, the small superconducting coils 1, 2, 2', 3, 3', 4, 4' and a magnetic shield member 8. The seven small super-conducting coils are connected in series electrically as shown in FIG. 2, and the direction of the current is the same in each of these coils. The magnetic flux (indicated by arrows) passes inside the magnetic shield and defines a closed circuit as depicted in the drawing. The bobbin 6 and the superconducting coils are stored in a cryostat 7, and the magnetic shield member 8 made of iron is mounted to the outside of this cryostat 7.

An excellent homogeneous magnetic field devoid of 2nd to 12th order inhomogeneous fields can be generated at the center of the magnet by selecting suitable relative positions of the superconducting coils and suitable values for magneto-motive force distribution. For instance, when computer simulation is executed for a magnet in the case where the homogeneous field at the center of the magnet is 1.5 T, the current density of the small superconducting coils is 200 A/cm$^2$, the maximum flux density inside the magnetic shield member 8 is about 1.5 T and the mean winding radius of all the small superconducting coils is equal, the following values can be obtained as the values of parameters which make the 2nd to 12th order inhomogeneous fields zero:

$z_2/r_2 = 0.283$,
$z_3/r_3 = 0.637$,
$z_4/r_4 = 1.288$ and,
$at_2/at_1 = 1.108$,
$at_3/at_1 = 1.586$,
$at_4/at_1 = 4.216$ Here, symbols have the same meaning as already defined in "Summary of the Invention".

Figure 3:
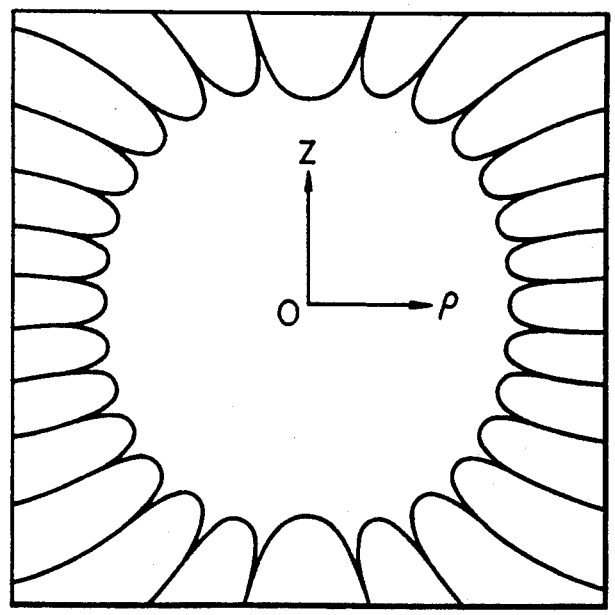
FIG. 3 is a contour line diagram of homogeneity of the field in the section of the superconducting magnet for MRI.

FIG. 3 shows the result of computation of homogeneity of the field in the cross section of the superconducting magnet described above. Homogeneity of the field describes a contour line of ±5 ppm. The homogeneous field region accounts for about 50% of the inner radius of the superconducting coil, and when compared with a prior art superconducting magnet comprising six small superconducting coils, the homogeneous field region can be improved by about 10%. Since the contour line has 28 concavo-convexities in all, it can be appreciated that a 14th order inhomogeneous field is a primary component, and the 2nd to 12th order inhomogeneous fields are made substantially zero.

In the computation example described above, the mean winding radius of all the seven small superconducting coils is assumed equal. However, a coil arrangement with somewhat different mean winding radii may also be employed. When the range of the parameters described above is examined by computer simulation about the case where the mean winding radius of each of the small superconducting coil is individually deviated by about a coil thickness, the values are given below:

$0.27 \leq z_2/r_2 \leq 0.31$, $0.60 \leq z_3/r_3 \leq 0.69$, $1.21 \leq z_4/r_4 \leq 1.43$, and, $1.04 \leq at_2/at_1 \leq 1.16$, $1.48 \leq at_3/at_1 \leq 1.68$, $3.95 \leq at_4/at_1 \leq 4.65$ In this way, excellent homogeneity of the field can be maintained.

As described above, since this embodiment can eliminate the 2nd to 12th order inhomogeneous fields, it provides the effect that a high homogeneous field can be obtained within the range by about 10% broader than in the prior art.

It is also possible to eliminate the 2nd to 12th order inhomogeneous fields and to obtain substantially the same effect as described above even in the case of a superconducting magnet not having the magnetic shield member 8, by adjusting the relative positions of the seven small superconducting coils and the magneto-motive force distribution. The relative position and magneto-motive force distribution of each small superconducting coil in this case fall under the range of the parameters described above, although the value of each parameter differs by several percents in comparison with the superconducting magnet having the magnetic shield member 8 of the embodiment described above.

FIG. 4 shows another embodiment of the present invention. In this embodiment, the superconducting magnet comprises four kinds of small superconducting coils 1, 1', 2, 2', 3, 3', 4 and 4'. These eight small superconducting magnets have a substantially equal mean winding radius in the same way as in the first embodiment, and are arranged symmetrically with respect to the central plane ($z=0$) of the magnet. The central axis of each small superconducting magnet is in conformity with the z axis. The eight small superconducting coils are connected in series electrically in the same way as in FIG. 2, and the direction of the current is the same in all of the small superconducting coils.

When the relative positions and magneto-motive force distribution of the small superconducting coils are determined by computer simulation in the same way as in the first embodiment, they fall under the range of the following parameters, and the 2nd to 12th order inhomogeneous fields contained in the magnetic field at the center can be eliminated:

$$0.11 \leq z_1/r_1 \leq 0.13,$$

$$0.36 \leq z_2/r_2 \leq 0.41,$$

$$0.67 \leq z_3/r_3 \leq 0.79,$$

$$1.26 \leq z_4/r_4 \leq 1.55$$

and, $$1.11 \leq at_2/at_1 \leq 1.24,$$

$$1.62 \leq at_3/at_1 \leq 1.84,$$

$$4.43 \leq at_4/at_1 \leq 5.20$$

When homogeneity of the field is plotted in the cross section of the superconducting magnet in the same way as in FIG. 3 in this embodiment, the homogeneous field region having homogeneity of the field of at least $\pm 5$ ppm is increased by about 20% in comparison with the conventional superconducting magnet comprising the six small superconducting coils. The contour line has 32 concavo-convexities in all, and the 16th order field becomes the inhomogeneous field.

Furthermore, the magnetic field generated by the superconductive coils and the magnetic shield member 8 in this embodiment will be explained in further detail by the use of the calculation values.

It will be assumed in FIG. 4, for example, that the radius and length in the axial direction of the inner peripheral surface of the magnetic shield are 800 mm and 2,100 mm, respectively, the thickness of the magnetic shield is 150 mm at all portions, the mean winding radius of each small superconducting coil is 420 mm, and the intensity of the central field is 1.5 T. Optimization computation of the coil arrangement under this condition is executed, and expansion coefficients $d_n$ generated by the superconducting coils and the magnetic shield are compared for each other. To begin with, the expansion coefficients are 1.407 T and 0.093 T or 1.5 T in total, for the component $d_0$ of the 0-order, that is, for the homogeneous field. As to the term of the second order, the expansion coefficients $d_2$ of the field generated by the superconducting coils and the magnetic shield member are $-0.043$ T/m$^2$ and $+0.043$ T/m$^2$, and the second order inhomogeneous field is eliminated. This also holds true of the fourth to 14th orders.

As described above, according to the optimal arrangement of coils of this embodiment, the second to 14-th order inhomogeneous fields can be eliminated substantially completely from the aspect of numeric calculation. The relation of the magnetic field generated by the superconducting coils and the magnetic shield 8 described above holds also true of the first embodiment and the following third embodiment.

Since the second to 14-th order inhomogeneous fields can be eliminated, this embodiment provides the effect that a high homogeneous field can be obtained within the range broader by about 20% than the prior art.

Figure 5:
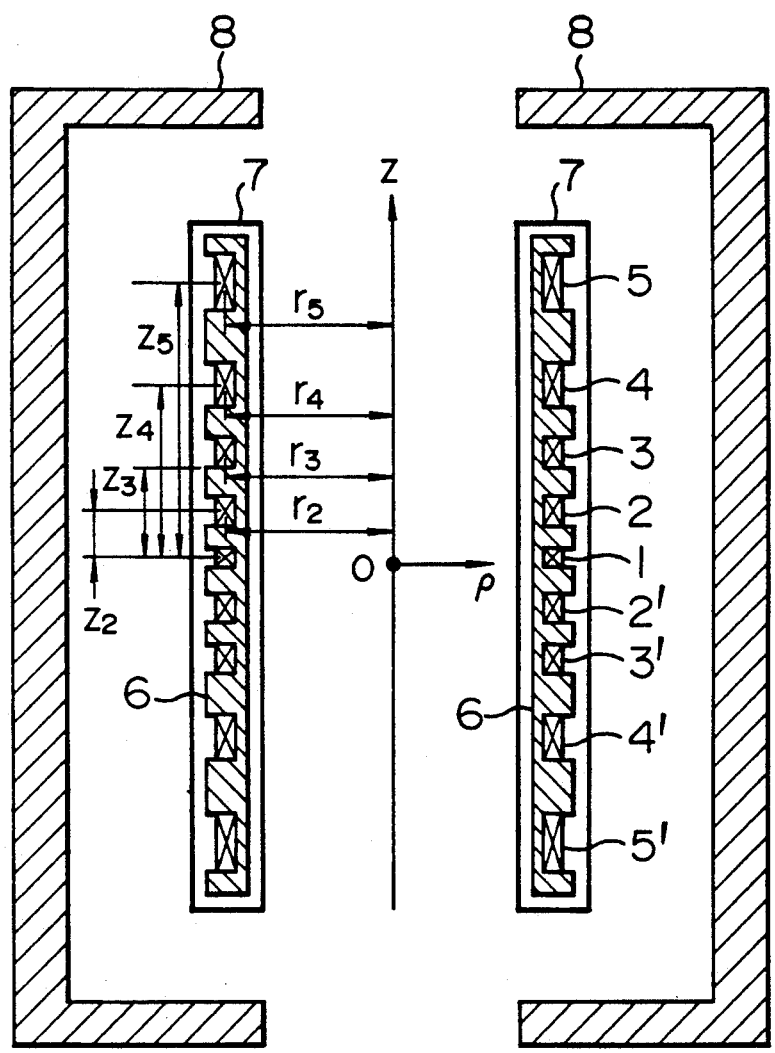
FIG. 5 is a sectional view of a superconducting magnet for MRI according to still another embodiment of the present invention.

FIG. 5 shows still another embodiment of the present invention. In this embodiment, the super-conducting coil comprises the small superconducting coil 1 and four kinds of small superconducting coils 2, 2', 3, 3', 4, 4'. These nine small superconducting coils have a substantially equal mean winding radius in the same way as in the first embodiment and are arranged symmetrically with respect to the central plane ($z=0$) of the magnet. The central axis of each small superconducting coil is in conformity with the z axis. The nine small super-conducting coils are connected in series electrically in the same way as in FIG. 2, and the direction of the current is the same in all of these superconducting coils.

When the relative positions and magneto-motive force distribution of the small superconducting coils are determined by computer simulation in the same way as in the foregoing embodiments, they fall within the range of parameters given below, and the second to 16th order inhomogeneous fields contained in the magnetic field at the center can be eliminated:

$$0.20 \leq z_2/r_2 \leq 0.24,$$

$$0.44 \leq z_3/r_3 \leq 0.50,$$

$$0.74 \leq z_4/r_4 \leq 0.88,$$

$$1.32 \leq z_5/r_5 \leq 1.63$$

and, $$1.00 \leq at_2/at_1 \leq 1.12,$$

$$1.21 \leq at_3/at_1 \leq 1.38,$$

$$1.80 \leq at_4/at_1 \leq 2.12,$$

$$4.96 \leq at_5/at_1 \leq 6.07$$

When homogeneity of the field is plotted in the section of the superconducting magnet in this embodiment in the same way as in FIG. 3, the homogeneous field region having homogeneity of the field of at least $\pm 5$ ppm can be improved by about 30% in comparison with the superconducting magnet comprising six conventional small superconducting coils. The contour line has 36 concavoconvexities in all, and the 18th order field becomes the inhomogeneous field.

According to this embodiment, a high homogeneous field can be obtained within the range broader by about 30% than in the prior art because the second to 16th order inhomogeneous fields can be eliminated.

In the embodiments of the present invention given above, the sectional structure of the magnetic shield member 8 is a relatively simple shape of ]— shape, but a more complicated shape may be used, as well.

Figure 6:
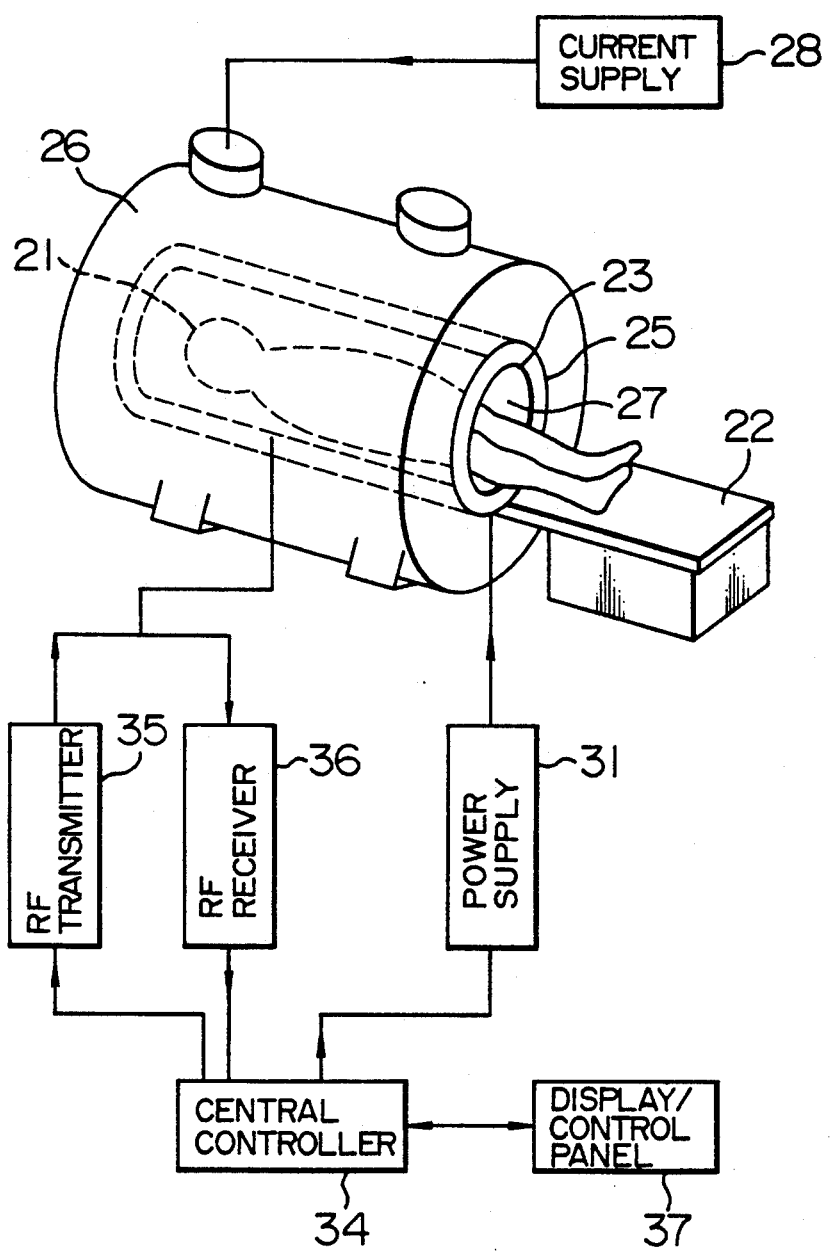
FIG. 6 is a structural view of an MRI diagnostic apparatus according to the present invention.

FIG. 6 is a structural view of an MRI diagnostic apparatus according to the present invention.

A subject or patient 21 is placed on a bed 22. A radio frequency (RF) coil 23 for detecting nuclear magnetic resonance (NMR) signals and a gradient coil 25 for generating a gradient field are so disposed as to encompass the patient 21. These coil systems are stored inside a warm bore 27 of a large-scale superconducting magnet 26. This superconducting magnet 26 is energized and de-energized by a current supply 28 through current leads 29. The gradient coil 25 comprises a coil providing a gradient field, and is connected to a power supply 31. The power supply 31 is connected in turn to a central controller 34.

The RF coil 23 comprises a transmission coil and a reception coil, which are connected to an RF transmitter 35 and to an RF receiver 36, respectively. The transmitter and receiver are connected to the central controller 34. The central controller 34 is connected to a display/control panel 37.

The MRI diagnostic apparatus according to the present invention can improve the homogeneous field region having homogeneity of at least ±5 ppm by about 10to about 30% in comparison with the case where a superconducting magnet assembly comprising six conventional small superconducting coils.

We claim:

1. A superconducting magnet assembly for MRI comprising:
   small superconducting coils disposed axially symmetrically with respect to a central axis and coaxially with said central axis;
   a non-magnetic bobbin having said small super-conducting coils wound thereon;
   a cryostat for storing said bobbin and said small superconducting coils; and
   a magnetic shield member fitted to the outside of said cryostat;
   wherein seven to nine of said small super-conducting coils are disposed so that the number of turns of said small superconducting coils becomes progressively greater towards the outside.

2. A superconducting magnet assembly for MRI according to claim 1, wherein when the number of said small superconducting coils is 7, the position and magneto-motive force of each of said small super-conducting coils are so set as to satisfy the following relations:

$$0.27 \leq z_2/r_2 \leq 0.31,$$

$$0.60 \leq z_3/r_3 \leq 0.69,$$

$$1.21 \leq z_4/r_4 \leq 1.43$$

and, $$1.04 \leq at_2/at_1 \leq 1.16,$$

$$1.48 \leq at_3/at_1 \leq 1.68,$$

$$3.95 \leq at_4/at_1 \leq 4.65$$

where $at_1$ is magneto-motive force of said small superconducting coil disposed at the center of said magnet, and $r_2$, $z_2$ and $at_2$; $r_3$, $z_3$ and $at_3$; and $r_4$, $z_4$ and $at_4$ are mean winding radius of first, second and third small superconducting coils from the center towards the outside in an axial direction, their mean distance from a central plane and their magneto-motive force, respectively.

3. A superconducting magnet assembly for MRI according to claim 1, wherein when the number of said small superconducting coils is 8, the position and magneto-motive force of each of said small super-conducting coils are so set as to satisfy the following relations:

$$0.11 \leq z_1/r_1 \leq 0.13,$$

$$0.36 \leq z_2/r_2 \leq 0.41,$$

$$0.67 \leq z_3/r_3 \leq 0.79,$$

$$1.26 \leq z_4/r_4 \leq 1.55$$

and, $$1.11 \leq at_2/at_1 \leq 1.24,$$

$$1.62 \leq at_3/at_1 \leq 1.84,$$

$$4.43 \leq at_4/at_1 \leq 5.20$$

where $r_1$, $z_1$ and $at_1$; $r_2$, $z_2$ and $at_2$; $r_3$, $z_3$ and $at_3$; and $r_4$, $z_4$ and $at_4$ are the mean winding radius of first, second, third and fourth small superconducting coils from the central plane of said magnet towards the outside in an axial direction, their mean distance from the central plane, and their magneto-motive force, respectively.

4. A superconducting magnet assembly for MRI according to claim 1, wherein when the number of said small superconducting coils is 9, the position and magneto-motive force of each of said small super-conducting coils are so set as to satisfy the following relations:

$$0.20 \leq z_2/r_2 \leq 0.24,$$

$$0.44 \leq z_3/r_3 \leq 0.50,$$

$$0.74 \leq z_4/r_4 \leq 0.88,$$

$$1.32 \leq z_5/r_5 \leq 1.63$$

and, $$1.00 \leq at_2/at_1 \leq 1.12,$$

$$1.21 \leq at_3/at_1 \leq 1.38,$$

$$1.80 \leq at_4/at_1 \leq 2.12,$$

$$4.96 \leq at_5/at_1 \leq 6.07$$

where $at_1$ is magneto-motive force of said small superconducting coil positioned at the center of said magnet, and $r_2$, $z_2$ and $at_2$; $r_3$, $z_3$ and $at_3$; $r_4$, $z_4$ and $at_4$; and $r_5$, $z_5$ and $at_5$ are the mean winding radius of the first, second third and fourth of said small super-conducting coils from the center towards the outside in an axial direction, their mean distance from said central plane, and their magneto-motive force, respectively.

5. An MRI diagnostic apparatus comprising:
   a bed for supporting thereon a subject;
   a radio frequency (RF) coil for detecting signals of nuclear magnetic resonance, encompassing said subject;
   a gradient coil for generating a gradient field, disposed around the outer periphery of said RF coil;
   a superconducting magnet disposed around the outer periphery of said gradient coil;
   a power supply for energizing said super-conducting magnet, a shim coil and said gradient coil; and
   a controller for controlling said power supply;
   wherein seven to nine small superconducting coils constituting said superconducting magnet are disposed in such a manner that the number of turns of said superconducting coils becomes progressively greater towards the outside.

6. An MRI diagnostic apparatus according to claim 5, wherein when the number of said small superconducting coils is 7, the position and magneto-motive force of each of said small superconducting coils are so set as to satisfy the following relations:

$$0.27 \leq z_2/r_2 \leq 0.31,$$

$$0.60 \leq z_3/r_3 \leq 0.69,$$

$$1.21 \leq z_4/r_4 \leq 1.43$$

and, $$1.04 \leq at_2/at_1 \leq 1.16,$$

$$1.48 \leq at_3/at_1 \leq 1.68,$$

$$3.95 \leq at_4/at_1 \leq 4.65$$

where $at_1$ is magneto-motive force of said small superconducting coil positioned at the center of said magnet, and $r_2$, $z_2$ and $at_2$; $r_3$, $z_3$ and $at_3$; and $r_4$, $z_4$ and $at_4$ are the mean winding radius of first, second and third of said small superconducting coils from the center towards the outside in an axial direction, their mean distance from said central plane, and their magneto-motive force, respectively.

7. An MRI diagnostic apparatus according to claim 5, wherein when the number of said small superconducting coils is 8, the position and magneto-motive force of each of said small superconducting coils are so set as to satisfy the following relations:

$$0.11 \leq z_1/r_1 \leq 0.13,$$

$$0.36 \leq z_2/r_2 \leq 0.41,$$

$$0.67 \leq z_3/r_3 \leq 0.79,$$

$$1.26 \leq z_4/r_4 \leq 1.55$$

and, $$1.11 \leq at_2/at_1 \leq 1.24,$$

$$1.62 \leq at_3/at_1 \leq 1.84,$$

$$4.43 \leq at_4/at_1 \leq 5.20$$

where $r_1$, $z_1$ and $at_1$; $r_2$, $z_2$ and $at_2$; $r_3$, $z_3$ and $at_3$; and $r_4$, $z_4$ and $at_4$ are the mean winding radius of first, second, third and fourth of said small superconducting coils from the center towards the outside in an axial direction, their mean distance from said central plane and their magneto-motive force, respectively.

8. An MRI diagnostic apparatus according to claim 5, wherein when the number of said small superconducting coils is 9, the position and magneto-motive force of each of said small superconducting coils are so set as to satisfy the following relations:

$$0.20 \leq z_2/r_2 \leq 0.24,$$

$$0.44 \leq z_3/r_3 \leq 0.50,$$

$$0.74 \leq z_4/r_4 \leq 0.88,$$

$$1.32 \leq z_5/r_5 \leq 1.63$$

and, $$1.00 \leq at_2/at_1 \leq 1.12,$$

$$1.21 \leq at_3/at_1 \leq 1.38,$$

$$1.80 \leq at_4/at_1 \leq 2.12,$$

$$4.96 \leq at_5/at_1 \leq 6.07$$

where $at_1$ is magneto-motive force of said small superconducting coil positioned at the center of said magnet, and $r_2$, $z_2$ and $at_2$; $r_3$, $z_3$ and $at_3$; $r_4$, $z_4$ and $at_4$; and $r_5$, $z_5$ and $at_5$ are the mean winding radius of first, second, third and fourth of said small superconducting coils from the center towards the outside in an axial direction, their mean distance from said central plane, and their magneto-motive force, respectively.

* * * * *